United States Patent [19]
Do et al.

[11] Patent Number: 5,353,235
[45] Date of Patent: Oct. 4, 1994

[54] WIRE LENGTH MINIMIZATION IN CHANNEL COMPACTOR

[75] Inventors: Kieu-Huong Do; Sunil Ashtaputre, both of San Jose, Calif.

[73] Assignee: VLSI Technology, Inc., San Jose, Calif.

[21] Appl. No.: 900,030

[22] Filed: Jun. 17, 1992

[51] Int. Cl.$^5$ .............................................. G06F 15/60
[52] U.S. Cl. .................................. 364/491; 364/488; 364/489; 364/490
[58] Field of Search ............... 395/325; 364/488, 489, 364/490, 491

[56] References Cited

U.S. PATENT DOCUMENTS

| | | | |
|---|---|---|---|
| 4,615,011 | 9/1986 | Linsker | 364/491 |
| 4,630,219 | 12/1986 | DiGiacomo et al. | 364/488 |
| 4,903,214 | 2/1990 | Hiwatashi | 364/491 |
| 4,965,739 | 10/1990 | Ng . | |
| 5,124,273 | 6/1992 | Minami | 364/491 |
| 5,267,177 | 11/1993 | Sato et al. | 364/491 |

*Primary Examiner*—Debra A. Chun
*Attorney, Agent, or Firm*—Burns, Doane, Swecker & Mathis

[57] ABSTRACT

A method of routing interconnections of devices in a planar field by the use of a computer. The method effectively shortens the length of all interconnections, including interconnections which connect points on the same device, in accordance with design rules. Also, the layers constituting the planar field can be assigned weights to effectively minimize the appearance of interconnections in the layer having the highest assigned weight.

16 Claims, 4 Drawing Sheets

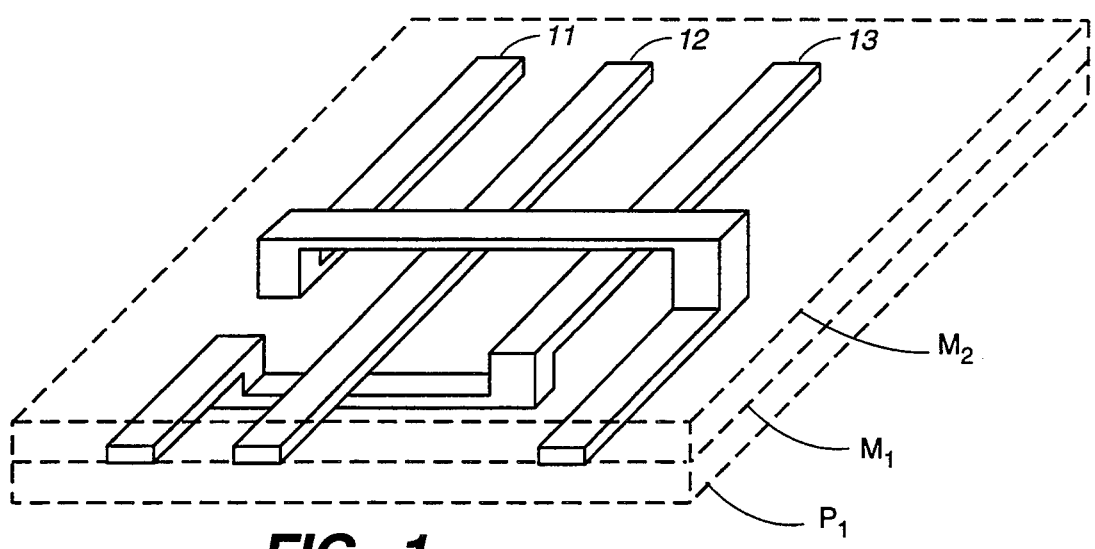
FIG._1
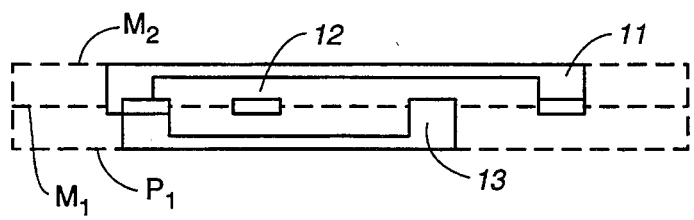
FIG._1A
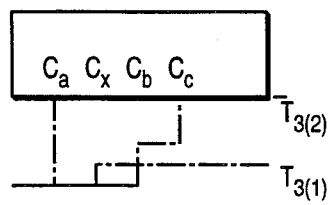
FIG._6A
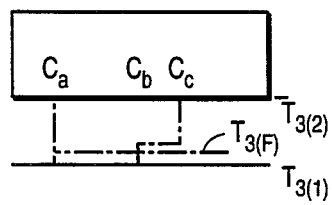
FIG._6B

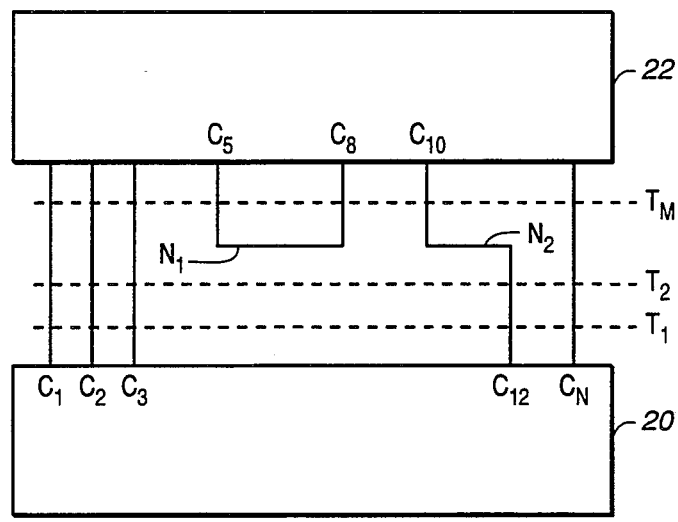
FIG._2
(PRIOR ART)
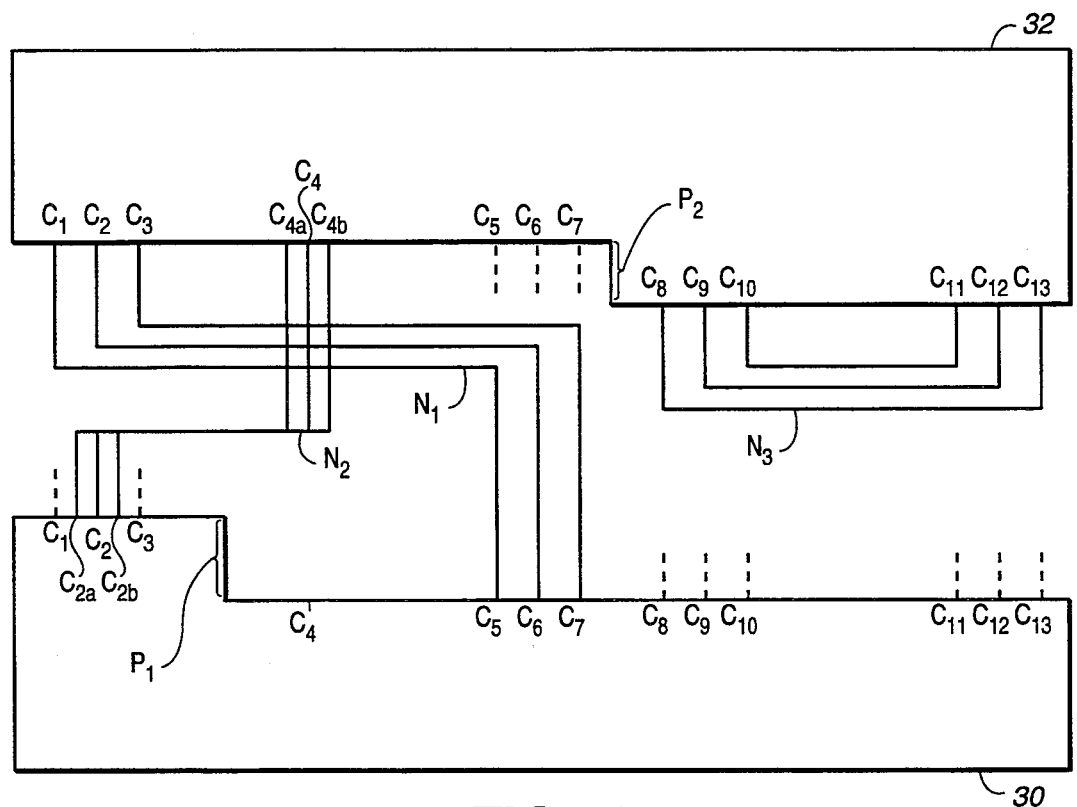
FIG._3

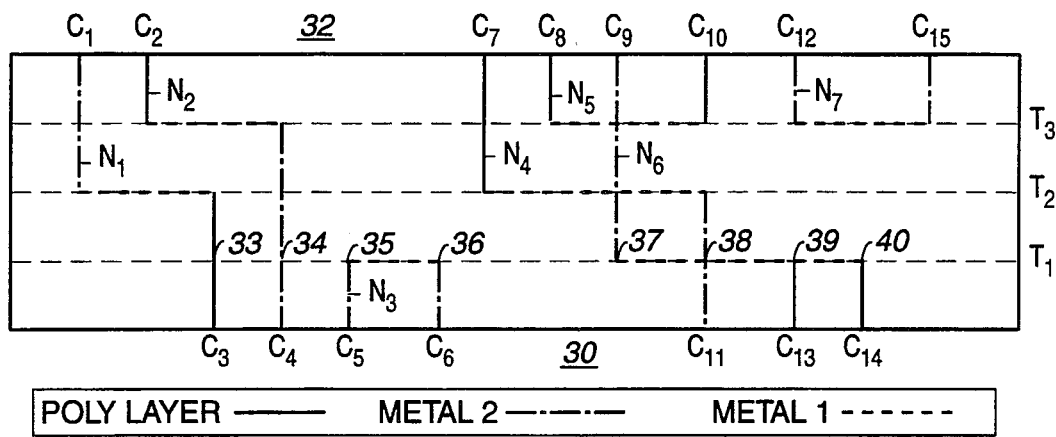
FIG._4
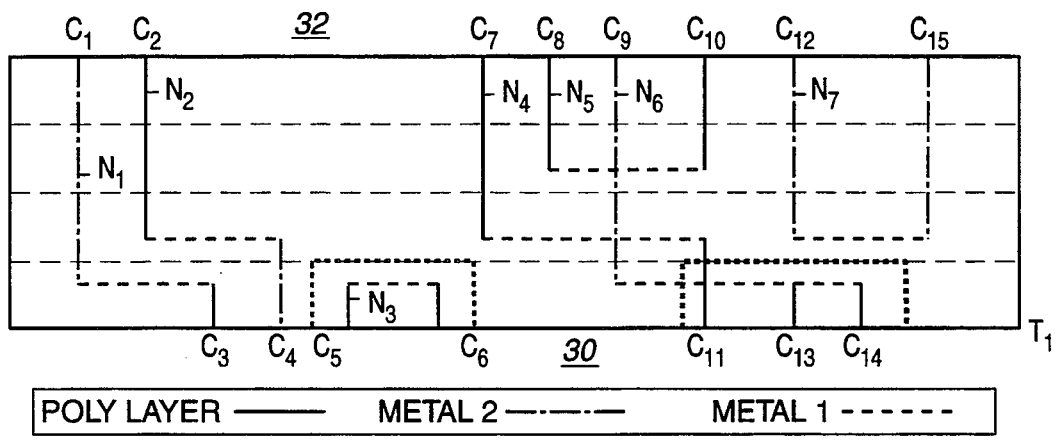
FIG._5A
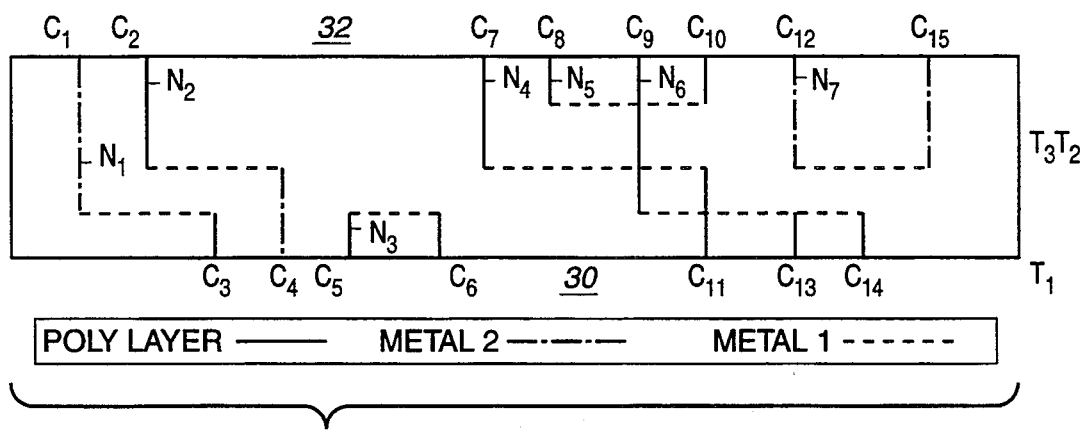
FIG._5B

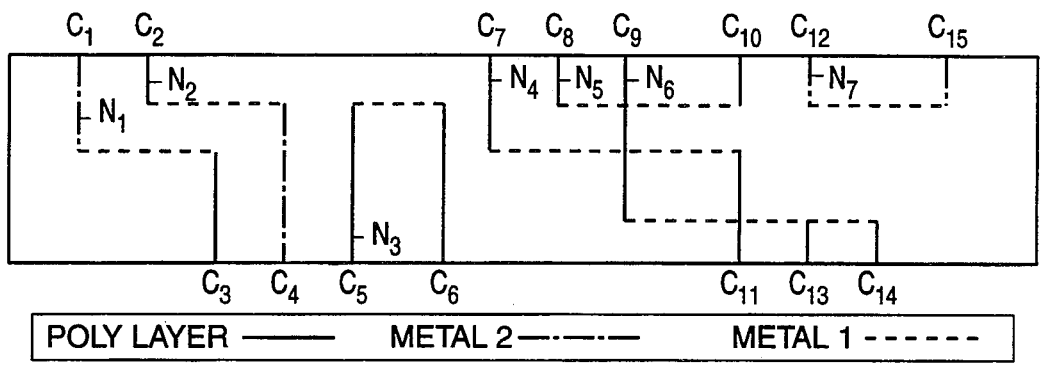
FIG._5C
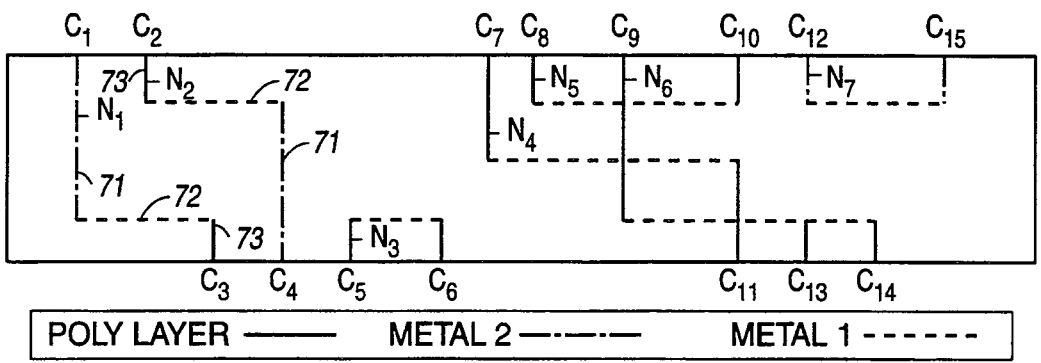
FIG._5D
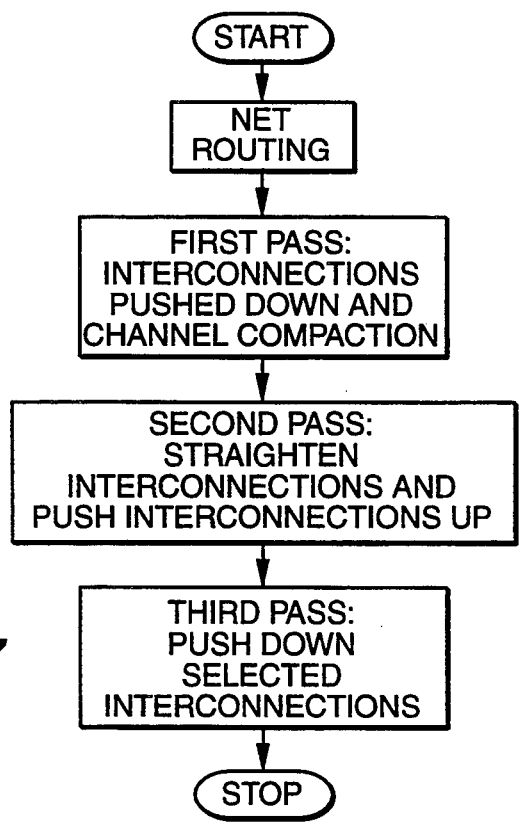
FIG._7

WIRE LENGTH MINIMIZATION IN CHANNEL COMPACTOR

BACKGROUND OF THE INVENTION

1. Field of the Invention:

A machine process in a digital computer operating in accordance with a computer program for routing electrical interconnections between electrical devices and for compacting the channel formed between the electrical devices.

2. Description of Related Art:

Routing interconnections between devices has long time been a design problem, particularly when the interconnections are restrained to a planar field having a limited number of levels. The planar field may be arbitrary in orientation, but will be described hereinafter as horizontal. Frequently the interconnections need to cross paths in a horizontal direction without intersecting. This requires at least one of the interconnections to shift in a vertical direction to avoid intersecting the other interconnection at a crossing point. Thus, at least one interconnection must be in a different level of the planar field so that the interconnections can cross paths without intersecting. FIG. 1 schematically illustrates the effect.

In FIG. 1, three interconnections 11, 12, 13 connect two devices (not shown) separated by a channel. The outer two interconnections 11, 13 exchange locations relative to the devices which requires both of the outer interconnections 11, 13 to cross the straight, central interconnection 12 without intersecting. This could not be accomplished in one level if the interconnections are to remain in the channel formed between the two devices. Therefore, the outer interconnections 11, 13 shift to different levels in order to cross paths. FIG. 1a illustrates a cross-sectional view of the interconnections 11, 12 and 13 shown in FIG. 1.

It should be appreciated that the routing of such interconnections has many applications. These applications include interconnecting electrical devices in a semiconductor chip and interconnecting discreet electrical devices, such as integrated circuit chips, through a layered wiring board. The routing techniques disclosed herein also have application to relatively complex piping systems, such as those found at chemical plants, or any other application where it is useful to route more than one continuous interconnection between objects without intersecting any other interconnection.

For ease of discussion, the following will be principally directed to applying the inventive technique to the routing of lead lines, or wires, between electrical devices formed in a semiconductor device. In such devices, wires are formed by more than one layer of conductive material, such as metalization layers M1, M2, or heavily doped polysilicon P3. Each conductive layer is insulated from the others by interposed insulation layers (not shown).

Each conductive layer is assigned a primary direction in which the wire segments appearing therein travel. For instance, a semiconductor substrate may have formed thereon three layers of conductive material, two of which form wire segments whose axes are perpendicular to the nearest side of the electrical devices. Wire segments are formed in the third layer have axes in a direction parallel to the electrical devices. The wire segments in each layer are connected to other segments through via holes in the insulation layers. In this system, at each instance an interconnection changes direction, or jogs, it must change its level, thereby requiring a via hole. It is desirable to reduce the number of via holes to avoid problems in alignment and reduce the complexity of formation.

Because of the desire to reduce the amount of unused or under-used space, particularly on a semiconductor chip, it is important that the devices being interconnected are as closely adjacent to one another as possible. The process of reducing the space between adjacent devices is called channel compaction. Compacting the channel formed between devices is, however, limited by design rules. Design rules are governed by, for example, spacing tolerances for wires. The design rules are also based on such things as resistance, inductance and capacitance, design and production restraints, material tolerances, etc.

Routing interconnections between devices quickly becomes complex as the number of interconnections increases. This complexity has led to the enlistment of computers. In the field of computer-aided design, a digital computer operating under a stored program routes interconnections between one electrical device and another electrical device on a planar field. In addition, such a digital computer compacts the channel or channels between the devices after they are interconnected or routed.

An example of a prior art technique for routing interconnections between devices and/or the positioning of devices after they have been routed by the use of a digital computer is disclosed in U.S. Pat. No. 3,681,782. This patent discloses a machine process for positioning interconnected components to minimize interconnection line length. Another method is disclosed in Rabbie and Jacobson, "Gridless Channel Routing and Compaction for Cell Based Custom IC Layout," *IEEE 1986 Custom Integrated Circuits Conference*, page 297, May 12, 1986. Rabbie and Jacobson disclose compacting by moving tracks against a contour of a device in one direction only. The Rabbie and Jacobson method is limited to rectangularly shaped objects that do not have any irregular contours and require even spacing of the interconnection pins. See also, Sangiovanni-Vincentelli et al., "A New Gridless Channel Router II (YACR II)," *Prod. International Conference On Computer-Aided Design* 84, pages 72–75, 1984; and Ng, "An Industrial World Channel Router for Non-Rectangular Channels," *Prod. 23rd Third Design Automation Conference*, pages 490–494, 1986. Hereinafter, these methods will be collectively referred to as the YACR method.

An improvement on the Rabbie and Jacobson technique is disclosed in U.S. Pat. No. 4,965,739 to Ng, commonly assigned to the assignee of the present application and incorporated herein by reference. In the Ng patent, a machine process for routing interconnections from one device to another device on a planar field with the aid of a computer is accomplished in two primary steps or passes. The first pass pushes contours of the wires toward one device to minimize the space occupied by each wire, at least in regions where the wires are most densely populated. Once the wires are as closely adjacent as feasible, the channel formed between the two devices is compacted by moving the devices toward one another, thus reducing the amount of space used for interconnecting the devices. A second pass straightens the wires to reduce the number of via holes. In other words, the jogs appearing in the wires are reduced in number.

The Ng patent represents an improvement over the preexisting methods. However, the routing process disclosed in the Ng patent can be improved upon. Using the technique disclosed in the Ng patent, the first pass pushes or shifts all the contours of the wires in one direction but, in some instances, this does not effectively shorten all the wires. For example, wires having starting and ending points on the same electrical device may actually be extended using this technique. This occurs when the starting and ending points appear on the device in a direction opposite to the direction the wires are pushed in the second pass of the Ng technique. The technique disclosed in the Ng patent does not accommodate these wires possibly causing the segments of these wires parallel to the devices to be pushed further from the device of their origin and termination, thus lengthening the wires.

The prior art techniques also do not take into account the cost differences among the various layers. Some layers may be more costly than the others. In this sense, cost may encompass not only the economic cost of forming wires but also the cost of increased resistance, capacitance and inductance formed by and around such wires, the difficulty in forming such wires, the amount of space occupied by such wires, the design restraints imposed thereon, etc. Generally, it is the electrical resistance which plays the most important factor. The net effect of the cost differences is that it is often desirable to minimize the amount of wire segments appearing in the costly conductive layers.

For example, the polysilicon layer P3 may be the most costly layer of three conductive layers, the other two of which may be metals M1 and M2 in a semiconductor structure. Thus, the prior art methods may result in the use of extensive amounts of the most costly conductive layer when a less costly conductive layer is a readily available alternative.

SUMMARY OF THE INVENTION

The present invention modifies the machine processes such as the YACR method and the machine process disclosed in the Ng patent to include an additional pass which determines which nets have a starting and ending point on a same device and to assure that those nets are not lengthened. The present invention also adds the capability of weighting the layers so that the use of the most costly layer is minimized.

The present invention is a machine process for routing interconnections between devices which includes the steps of defining representations of the devices; defining columns in a channel bounded by representations of two devices to be interconnected; defining tracks in the channel, the tracks being parallel to one another and perpendicular to axes of the columns; and defining nets representing interconnections of points on the devices. The inventive process further includes the steps of compressing the channel by moving all points of a net in a track toward a representation of a first of the devices within each column; straightening the nets to minimize the number of jogs appearing therein; and shortening nets which connect points on the second of the devices by moving all points of the net in a track toward the second of the devices.

When the nets represent interconnections formed in layers (with each layer including portions of the interconnections the axes of which travel in the direction of either columns or tracks), the present invention includes a step of assigning weights to each of the layers, wherein the assigned weights govern the priority of moving the nets, thereby shortening the portions of the nets appearing in layers having greater weight. The assigned weighting can be input by a user of the machine process.

Other aspects of the invention will become apparent from the detailed description provided below.

BRIEF DESCRIPTION OF THE DRAWINGS

The present invention will now be described with reference to the attached drawing figures, in which:

FIG. 1 is a schematic illustration of interconnections routed in a three layer planar field;

FIG. 1a is a schematic cross-sectional illustration of the interconnections shown in FIG. 1;

FIG. 2 is a schematic diagram of a step in a prior art method of routing interconnections from one device to another device in a planar field by use of a programmed digital computer;

FIG. 3 is a schematic block diagram of a step in the method for routing interconnections of one device to another device of the present invention;

FIG. 4 is a schematic block diagram of a step in the method of the present invention for positioning two devices on a planar field;

FIGS. 5(a–d) are steps in the method of the present invention for positioning two devices in a planar field;

FIGS. 6(a–b) are steps showing the positioning of a track in a profile to minimize jogs in the interconnection; and FIG. 7 is a flow chart of a machine process in accordance with the present invention.

DETAIL DESCRIPTION OF THE PREFERRED EMBODIMENTS

Because the present invention is adaptable to both the YACR method and the method disclosed in the Ng patent, both methods will be addressed below.

FIG. 2 is a block diagram of a first object 20 and a second object 22. The objects 20 and 22 are typically devices on a planar field and are typically symbolic representations of semiconductor integrated circuits. As such, wires interconnecting objects 20 and 22 must be routed from pins in one device 20 to pins in the other device 22.

As previously described, in the method of the prior art known as YACR, the method of routing interconnections from pins in one device 20 to pins in another device 22 on a planar field is accomplished by use of a programmed digital computer. In the YACR method, the program begins with rectangularly shaped devices. A plurality of columns, $C_1 \ldots C_n$, are established from one device 20 to the other device 22. The columns $C_1 \ldots C_n$ are perpendicular to the sides of the devices facing each other and are established evenly spaced from one another. The columns are directed to locations where electrical pins of the devices appear. The columns must be spaced apart by at least the distance of a routing pitch, which distance is governed by design rules. In addition, a plurality of parallel tracks $T_1 \ldots T_m$, is established. The tracks $T_1 \ldots T_m$ appear between the devices 20 and 22 and are generally parallel with the sides of the devices facing each other. These tracks $T_1 \ldots T_m$ intersect the vertical columns $C_1 \ldots C_n$, and are substantially perpendicular thereto.

In the YACR method, the nets are then defined. A net is a symbolic representation of a tracing of a wire from a pin on one device to another pin. The other pin can be in the same device 20 or can be in the other device 22. The beginning column of each net to the end column of that net is traced for all nets. Thereafter, the density of the tracks in each column is calculated. The calculation is simply the number of tracks appearing in each column in which a segment of a net appears.

Because the vertical columns are evenly spaced apart, the YACR method can route only nets with a fixed width. Further, as previously stated, the pins must be located on the columns, thereby restricting the location of the pins to the fixed positions.

FIG. 3 is a symbolic representation of devices 30 and 32 used in the method of the present invention and U.S. Pat. No. 4,965,739 to Ng. In contrast to the YACR method, the devices 30 and 32 need not be rectangularly shaped. Thus, in FIG. 3, the first device is shown with a rectangularly shaped appendage having a length $P_1$ attached to the first device 30. Similarly, the second device 32 is not rectangularly shaped.

In the method of routing interconnections from one device to the other device, columns are first established for each of the devices 30 and 32, extending generally vertically from one device to another device. However, the vertical columns need not be placed evenly spaced apart. Instead, since the distance between each pin to a device may have a variable width, a vertical column is established along the center point of each pin, as well as the two endpoints of each pin. The vertical columns are then extended to the other device. Thus, in FIG. 3, a pin having a width defined as the difference in position between $C_3$ and $C_1$ is defined in the other device 32.

The vertical columns $C_1$, $C_2$ and $C_3$ extend from the other device 32 to the first device 30. If a pin had only a single track width, as shown in the first device 30 in the column $C_3$, a single horizontal line then extends between the one device 30 and the other device 32. Since the columns can be in any location, the pins can also be at any location so long as the spacing between the pins follow the constraint of the method to make the devices. To those skilled in the art, this is termed routing of gridless pins.

Similar to the YACR and the Ng methods, nets are established and the beginning column of one net to the end column of that net is traced for all nets. Each net is the symbolic representation of each interconnection. Thus, in FIG. 3, a first net, $N_1$ is the interconnection from the other device 32 at the location of $C_1$-$C_2$-$C_3$ to a pin defined in the one device 30 having a location of $C_5$-$C_6$-$C_7$. A second net, $N_2$, is from the pin $C_2$ in the one device 30 extending to column $C_4$ in the other device 32. A third net, $N_3$, is defined by the columns $C_8$-$C_9$-$C_{10}$ of the other device 32 extending to the column $C_{11}$-$C_{12}$-$C_{13}$ of the other device 32.

Thereafter, the density of each column is calculated. The density is calculated by adding the track widths of all the nets that cross each column. Thus, in FIG. 3, the density calculation for each column is as follows:

---

Density of $C_1$ = Track width of net 1
Density of $C_2$ = Track width of net 1 + Track width of net 2
Density of $C_3$ = Track width of net 1
Density of $C_4$ = Track width of net 1 + Track width of net 2
Density of $C_5$ = Track width of net 1
Density of $C_6$ = Track width of net 1
Density of $C_7$ = Track width of net 1

---continued

Density of $C_8$ = Track width of net 3
Density of $C_9$ = Track width of net 3
Density of $C_{10}$ = Track width of net 3
Density of $C_{11}$ = Track width of net 3
Density of $C_{12}$ = Track width of net 3
Density of $C_{13}$ = Track width of net 3

---

If the devices 30 and 32 are not rectangularly shaped, as in the case in the example shown in FIG. 3, then an offset as added to each vertical column density due to the geometry of the offset. Thus, the density of Column $C_1$, $C_2$, and $C_3$ are all incremented by the amount $P_1$. Similarly, the density of $C_8$, $C_9$, $C_{10}$, $C_{11}$, $C_{12}$ and $C_{13}$ are also incremented by the length $P_2$.

Preferably, the routing of columns in a vertical direction is done in one layer, typically a first metalization layer $M_1$. Routing of interconnections in a horizontal direction is done in a second layer, typically the second metalization layer $M_2$. A third layer may be added for interconnections in a vertical direction, typically a polysilicon layer $P_3$. The routing of interconnections can be either horizontal or vertical, depending on the requirements of the circuit. The nature and order of the layers are not critical.

If a pin, however, is in the second layer $M_2$ and it is desired to route the net from that pin in a vertical direction, i.e., in the first layer $M_1$, it is first necessary to route the pin to a via hole, which is an inter-layer connection connecting $M_2$ to $M_1$ and then route the net in layer $M_1$. The same holds true with respect to the third layer. The via hole contributes to the density. Therefore, the number of tracks occupied by the width of a via hole must be added to the density for the density calculation. A data structure is built by the computer program which allocates memory for each column.

Thereafter, as disclosed in the Ng patent, a cost equation for net assignment can be made. The cost equation is calculated in accordance with the program set forth as follows:

---

```
integer i, j, netno, theNet, densitySum, den res;
long integer maxCost, netCost;
pointer (prLocalNetClass) net;
pointer (prLocalPinClass) pin;
pointer (prColClass) col;
res := (routeDensity div 5) max 1; # resolution
for netno := 1 upto nets.listsize do begin
  net := at(nets, netno);
  if net.usedTracks.listsize > = routeDensity
  then return(false);
  densitySum := 0;
  for i := 1 upto net.pins.listsize do begin
    pin := at(net.pins, i);
    den := 0;
    for j := pin.lsColNo upto pin.rsColNo do begin
      col := at(columns, j);
      if (pin.flags tst pinOnTopp) then begin
        if col.bpin the den .max (density.buffer[j] div res);
      end else if pin.flags tst pinOnBot then begin
        if col.tpin then den .max (density.buffer[j] div res);
      end;
    end;
    densitySum .+ den;
  end;
  net.assignCost := cvli(net.usedTracks.listsize)*highCost
    + cvli (densitySum)*mediumCost
    + cvli (net.level + net>blevel);
end;
```

This first cost equation is well known in the art.

Once the calculation for cost is made, the program selects the net with the highest cost from the first cost equation. In the YACR method, the vertical column with the highest density is first selected. The present invention is adaptable to either method.

Once a net with the highest cost is selected, a second cost calculation is used to reflect the cost of assigning that net to a particular track. The assignment of a net to a track may be done in accordance with the program available from U.S. Pat. No. 4,965,739 to Ng. In general, according to the Ng patent, a net can occupy a number of tracks because it is of variable width. In the YACR method, a net is representative of one track width. The program set forth in the Ng patent also constructs a vertically weighted constraint graph.

In an embodiment of the present invention adapted to the YACR method, because each column is of unity width, if a plurality of interconnections cross a particular column, the constraint for that column is simply the number of tracks which cross the column.

The embodiment of the present invention adapted to the method of the method of the Ng patent permits routing of interconnections with variable width, so that the constraint in each column must be weighted by the number of interconnections and the width of each interconnection which crosses that column. The net is assigned to a horizontal track with the lowest cost based upon the second cost equation. The net assigned to that available horizontal track with the lowest cost is then routed.

The steps of calculating the net assignment and assigning the next highest cost net to a horizontal track is then performed and all other nets are then assigned to appropriate horizontal tracks. In the embodiment adapted to the YACR method, the selection of other columns is accomplished by proceeding to the right or to the left of the vertical column with the highest density that was first selected. The vertical columns of each net are then connected to the horizontal track for that net routing.

A suitable program to achieve the foregoing method is accomplished by the use of a modified version of the program available on microfiche from the Ng patent file.

Once the wire has been routed, it is desirable to move the devices 30 and 32 to as close together as possible. This is because in the semiconductor industry, it is desirable to have the integrated circuits produced on as small a scale as possible, thereby increasing the yield on any given size wafer.

Referring to FIG. 4, two semiconductor devices 30 and 32 routed in accordance with the method of the present invention are shown. The interconnections are shown only as connecting the center point of each pin. The end points of the pins are not shown. In the method of compacting the devices or positioning the two devices, it is not necessary to know the end points of the routed wires. Thus, the above-described compaction method can be used with devices routed with any suitable prior art method.

The machine process for positioning the two devices is again accomplished by the use of a programmed digital computer having stored therein a computer program according to an exemplary embodiment. The two devices 30 and 32 are separated by a region which is defined by a plurality of substantially parallel columns from one device to another device and by a plurality of substantially parallel tracks, each of which is substantially perpendicular to the columns. The devices 30 and 32 are interconnected by a plurality of interconnections. A portion of each of the interconnections lies on a column and on a track. In the example shown in FIG. 4, three tracks are shown having the designation of $T_1$, $T_2$ and $T_3$ respectively. There are fifteen vertical columns, namely, columns $C_1$ through $C_{15}$.

The distance between adjacent tracks is referred to as the via-to-via spacing. This is distinct from the line-to-line spacing defined by the distance between adjacent vertical segments of interconnections. Generally, the line-to-line spacing can be much smaller than the via-to-via spacing following the design rules.

For simplicity of presentation, the devices are shown as rectangularly shaped. However, the compaction method of the present invention can be practiced with non-rectangularly shaped devices. For clarity, the interconnections in the polysilicon layer are shown as a solid line, wires in the first metal layer M1 are shown as a dashed line and wires in the second metal layer are shown as a chained line.

Referring to FIG. 5a, there is shown a part of a first step in the method of the present invention according to a preferred embodiment. The present invention preferably begins with one of the two devices. In this case, the first device 30 is chosen. Thereafter, the track closest to that first device 30, in this case track $T_1$, is moved. The track $T_1$ is moved by moving each point along that track which is intersected by a column to as close to the one device 30 as permitted by the design rules. Thus, in track $T_1$, there are eight points 33–40, which are intersected by the fifteen columns (shown in FIG. 4). The eight points define nine segments of track $T_1$. A first segment is the region leftmost of device 30 extending to point 33. The second segment lies between the points 33 and 34. The third segment lies between the points 34 and 35. The fourth segment lies between the points 35 and 36. The fifth segment lies between the points 36 and 37, and so on until the rightmost edge.

Since no interconnection lies on the first, second and third segments, the corresponding portion of track $T_1$ may be moved all the way against the edge of the first device 30. The fourth segment, the line between points 35 and 36, has the wire for net $N_3$ lying thereon. It can be moved as close to first device 30 as possible within the constraints of the design rules which permit the routing of that wire. In short, the wire has a certain width and the process of making the wire has certain parameters regarding how close the next object can be to the boundaries of the wire width which restrain how far the wire can be moved to the first device 30 without violating the design rules.

The same process is carried out for each of the remaining segments. Thus, a new profile for the track would have the shape shown in FIG. 5a in which track $T_1$ takes on a solid line. Between Columns $C_5$ and $C_6$, track $T_1$ is at a via-to-via spacing from device 30. This is as close to device 30 as the track $T_1$ can be moved to device 30.

After the track $T_1$ is moved, a new guard frame is established for track $T_1$. The guard frame is the constraint by which other tracks can be moved as close to track $T_1$ as possible. The guard frame comes into effect in the second segment in which there is a segment of wire. The new guard frame for track $T_1$ is shown in FIG. 5a as a dotted line. The dotted line shows the closest position to track $T_1$ to which any object or track can be moved due to the wire in segment 2.

FIG. 5a shows the result of similar operations in which track $T_2$ is then moved as close to track $T_1$ as possible by moving each point in the track intersected by a column. Track $T_2$ would then also have a new profile. A new guard frame is then established for track $T_2$. Similarly, track $T_3$ is moved as close to track $T_2$ as possible. In the same manner as tracks $T_1$ and $T_2$, a new guard frame will also be established for track $T_3$.

Once the last track furthest away from the first device 30 is moved, the other device 32 is then moved in the direction towards the first device 30 to a position as close to the last track moved as possible. Thus, the device 32 is moved as close to track $T_3$ as possible, as shown in FIG. 5b. This step constitutes the channel compression and the completion of the first pass or push of the nets toward the first device 30.

Thereafter, track $T_3$, the last moved track in the first pass, is then moved in a direction away from the one device 30 and towards the other device 32 as shown in FIG. 5c. Track $T_3$ is moved as close to the other device 32 as possible. Each point intersected by a column in track $T_3$ is moved as close to the other device 32 as possible. Between the first and second moves for the track $T_3$, the straightest segment of the track moved that has an interconnection line thereon is selected. This is to choose a segment of wire which is as straight as possible with a minimum number of jogs therein. With the straightest possible segment being selected, a guard frame is then established for that track. This becomes the final profile for track $T_3$.

If the first profile and the second profile overlap such that the straightest segment of the track moved cannot be found between the two profiles, then the second profile for the track $T_3$ is deliberately moved away from other device 32 such that the two profiles will not overlap. Track $T_2$ is then moved as close to the final profile for track $T_3$ as possible. A new guard frame for track $T_2$ is established. This step is repeated for track $T_1$ and is moved to track $T_2$ as close as possible. Finally, the one device 30 is moved as close to track $T_1$ as possible. This pass constitutes the second pass, the results of which are shown in FIG. 5c. This process is further explained referring to FIGS. 6a and 6b.

In FIGS. 6a and 6b, the steps of moving a track $T_{3(2)}$ and the selection of a final profile $T_{3(F)}$ are shown. In these figures, the tracks will be shown as chain lines. In FIG. 6a, there is shown track $T_3$ with the first profile $T_{3(1)}$ and the second profile $T_{3(2)}$. The interconnection on track $T_{3(1)}$ between columns $C_a$ and $C_c$ is not a straight line. There is a jog at $C_x$. In the method of compaction of the present invention, $T_{3(1)}$ is moved away from $T_{3(2)}$ by an amount sufficient to insure that the profiles $T_{3(2)}$ and $T_{3(1)}$ do not overlap in the area where there is an interconnection. The movement of $T_{3(1)}$ away from $T_{3(2)}$ is shown in FIG. 6b. The resultant profit $T_{3(F)}$ chosen is a straight line connection between $C_a$ and $C_c$. Compaction of position is sacrificed to decrease the number of jogs which can cause interconnection failures.

FIG. 5c illustrates one of the problems addressed by the present invention. The third net $N_3$, and correspondingly the interconnection represented thereby, is actually lengthened. This occurs when both sides of the net terminate at the device from which the net contours are moved. This is because the contours of each of the nets are moved in the direction of the device 32 without regard to the fact that both terminal points occur at the other device 30.

The lengthening of the third net $N_3$ increases the cost of the interconnection represented by the net. Therefore, the present invention adds a third pass shown in FIG. 5d to the prior art methods. The nets terminated on one device 30 are identified as such, and those nets terminating the one device 30 are moved toward the one device 30 in the same manner as done in the first part of the channel compression step or pass discussed above. The nets, being representations of interconnections in the computer, are preferably identified in the computer by a few additional steps in the operating program. However, the identification information can be input through an interface such as a keyboard, if desired. Thus, the interconnections having ends which originate and terminate on one device are shortened regardless of which device they are associated with.

The present invention adds the ability for the user to weight the use of the various layers. In multiple layer interconnection structures, one layer may be more costly than others. As mentioned above, the cost of an interconnection can be determined using a multitude of factors. For instance, in wiring structures, the cost may involve the capacitance, resistance and inductance created by the interconnection, as well as the difficulty of formation, reliability, structure and processing restraints. The cost may vary significantly between layers, particularly when the layers are made of different materials, such as metalization layers M1, M2 and polysilicon layers. In such structures, the polysilicon layer P3 is usually the most costly because of its high electrical resistance.

Weights may be assigned to the various levels through an interface, such as a keypad. In the Figures, the polysilicon layer P3 is assigned a weight factor of three, while the two metal layers M1 and M2 are assigned a weight factor of zero. These weights are used to minimize the lengths of interconnections in the more costly layers. FIG. 5d illustrate the effect. The three sections of the interconnections represented by the first and second nets $N_1$ and $N_2$ appear in three different layers, such as shown in FIG. 5d. The three sections include a first section 71 in a metalization layer M1, a second section 72 in a second metalization layer M2 and a third section 73 in a polysilicon layer P3. If the polysilicon layer P3 is selected as the most costly, the programmed computer will minimize the amount of wire length representing the interconnection appearing therein.

In the instance of nets $N_1$, Net $N_1$ is pushed down to shorten the length of the segment 73 appearing in layer P3. Of course the length of the segment 71 appearing in the first metal layer M1 is lengthened, which is acceptable due to the lower expense associated with using metal interconnections in this example.

This weighing of the layers effectively prioritizes the routing of the interconnections represented by the nets. The weighting of the layers effectively prioritizes the track assignment of the nets. The layer weight is programmable by the user. This weight is then read into the system and is added to the cost function which is used for the track assignment of the nets. The higher the cost is, the closer the track to the pin with higher weight will be assigned. This weight later on is used by the compactor, at the third pass, to decide whether or not the track should be pulled down.

FIG. 7 is a flow chart summarizing the above process. As shown in FIG. 7, after net routing is completed, a first pass occurs wherein the interconnections are pushed down and channel compaction takes place. After the first pass, a second pass straightens the interconnections and the wires are pushed up. Following this step, a third pass selected interconnections are pushed down depending on their weight and termination points.

The method of the present invention for routing interconnection between one device to another device may be accomplished by a modified version of the computer program available in microfiche form from U.S Pat. No. 4,965,739 to Ng. The program required to implement the disclosed method is within the skill of an ordinary artisan without undue experimentation.

There are many advantages to the method of routing of the present invention. The present invention minimizes the length of all the interconnections represented by the nets, whereas the prior art methods missed some opportunities to do so. Also, the present invention minimizes the use of the more costly layers, without significant sacrifice to the overall design.

What is claimed is:

1. A machine process for routing interconnections between devices, the process comprising:
    defining representations of the devices;
    defining columns in a channel bounded by representations of two devices to be interconnected;
    defining tracks in the channel, the tracks being substantially parallel to one another and substantially perpendicular to axes of the columns;
    defining nets representing interconnections of points on the devices;
    compressing the channel by moving all points of a net on a track toward a representation of a first of the devices within each column;
    straightening the nets to minimize the number of jogs appearing therein; and
    shortening nets which connect points on the second of the devices by moving all points of the net on a track toward a second of the devices.

2. A machine process according to claim 1, wherein the nets represent interconnections formed in layers, each layer including portions of the interconnections the axes of which travel in the direction of either columns or tracks.

3. A machine process according to claim 2, further comprising the step of assigning weights to each of the layers, wherein said weights relate to comparative cost of using respective layers and the layer having the highest assigned weight bears the least amount of the interconnections.

4. A machine process according to claim 3, wherein a user of the machine process inputs the weights assigned to the layers.

5. A machine process according to claim 2, further comprising a step of assigning weights to each of the layers, wherein the assigned weights govern the priority of moving the nets, thereby shortening the portions of the nets appearing in layers having greater weight.

6. A machine process according to claim 5, wherein a user of the machine process inputs the weights assigned to the layers.

7. A machine process for routing interconnections between devices, the process comprising:
    defining representations of the devices;
    defining columns in a channel bounded by representations of two devices to be interconnected;
    defining tracks in the channel, the tracks being substantially parallel to one another and substantially perpendicular to axes of the columns;
    defining nets representing interconnections of points on the devices wherein the nets represent interconnections formed in layers, each layer including portions of the interconnections the axes of which travel in the direction of either columns or tracks;
    compressing the channel by moving all points of a net in a track toward a representation of a first of the devices within each column;
    straightening the nets to minimize the number of jogs appearing therein;
    assigning weights to the layers, wherein said weights relate to comparative cost of using respective layers; and
    minimizing the amount of the nets appearing in each layer according to its assigned weight.

8. A machine process according to claim 7, further comprising the step of moving all points of a net in a track toward a second of the devices when the net connects points on the second of the devices.

9. A machine process for routing interconnections between devices, the process comprising:
    compressing channels bounded by representations of devices;
    straightening nets representing interconnections between the devices to minimize the number of jogs appearing therein; and thereafter
    shortening nets which connect two points on one of the devices.

10. A machine process according to claim 9, wherein the nets represent interconnections formed in layers, each layer including portions of the interconnections the axes of which travel in the direction of either substantially perpendicular to the representations are substantially parallel to the representations.

11. A machine process according to claim 10, further comprising the step of assigning weights to each of the layers, wherein said weights relate to comparative cost of using respective layers and the layer having the highest assigned weight bears the least amount of the interconnections.

12. A machine process according to claim 11, wherein a user of the machine process inputs the weights assigned to the layers.

13. A machine process according to claim 10, further comprising a step of assigning weights to each of the layers, wherein the assigned weights govern the priority of moving the nets, such that portions of the nets appearing in layers having greater weight are shortened.

14. A machine process according to claim 13, wherein a user of the machine process inputs the weights assigned to the layers.

15. A machine process for routing interconnections between devices, the process comprising:
    compressing a channel bounded by representations of devices;
    straightening nets representing interconnections of points on the devices wherein the nets represent interconnections formed in layers, the layers including portions of the interconnections the axes of which travel in the direction of either perpendicular or parallel to the representations of the devices;
    assigning weights to the layers, wherein said weights relate to comparative cost of using respective layers; and
    minimizing the amount of the nets appearing in each layer according to its assigned weight.

16. A machine process according to claim 15, further comprising the step of shortening nets which connect two points on one of the devices.

* * * * *